United States Patent [19]
Kleinhenz et al.

[11] Patent Number: 6,140,175
[45] Date of Patent: Oct. 31, 2000

[54] SELF-ALIGNED DEEP TRENCH DRAM ARRAY DEVICE

[75] Inventors: Richard L. Kleinhenz, Wappingers Falls; Carl J. Radens, LaGrangeville, both of N.Y.

[73] Assignee: International Business Machines Corporation, Armonk, N.Y.

[21] Appl. No.: 09/261,690

[22] Filed: Mar. 3, 1999

[51] Int. Cl.$^7$ .............................................. H01L 21/8242
[52] U.S. Cl. .................. 438/243; 438/244; 438/248; 438/239; 438/386; 438/387; 438/585; 257/301
[58] Field of Search .................................. 438/243, 244, 438/245, 246, 239, 242, 386, 387, 391, 947, 430, 585; 257/296, 301

[56] References Cited

U.S. PATENT DOCUMENTS

| | | | |
|---|---|---|---|
| 4,645,564 | 2/1987 | Morie et al. | 156/643 |
| 4,728,623 | 3/1988 | Lu et al. | 437/52 |
| 4,816,884 | 3/1989 | Hwang et al. | 357/23.6 |
| 4,939,104 | 7/1990 | Pollack et al. | 438/561 |
| 5,156,992 | 10/1992 | Teng et al. | 438/246 |
| 5,170,234 | 12/1992 | Baglee et al. | 257/301 |
| 5,216,265 | 6/1993 | Anderson et al. | 257/301 |
| 5,360,785 | 11/1994 | Yoshida et al. | 505/474 |
| 5,369,049 | 11/1994 | Acocella et al. | 437/52 |
| 5,380,674 | 1/1995 | Kimura et al. | 437/52 |
| 5,395,786 | 3/1995 | Hsu et al. | 437/52 |
| 5,422,294 | 6/1995 | Noble, Jr. | 438/246 |
| 5,461,248 | 10/1995 | Jun | 257/301 |
| 5,563,433 | 10/1996 | Nagata et al. | 257/301 |
| 5,614,431 | 3/1997 | DeBrosse | 438/243 |
| 5,670,805 | 9/1997 | Hammerl et al. | 257/301 |
| 6,008,104 | 12/1999 | Schrems | 438/386 |
| 6,037,210 | 3/2000 | Leas | 438/245 |

*Primary Examiner*—David Hardy
*Assistant Examiner*—N. Drew Richards
*Attorney, Agent, or Firm*—McGinn & Gibb, P.C.; Daryl K. Neff, Esq.

[57] ABSTRACT

An integrated circuit and a method of manufacturing an integrated circuit comprises forming an insulator over a substrate, forming a trench in the insulator and the substrate, undercutting the insulator to form a gate conductor opening between the substrate and the insulator adjacent the trench, and forming a gate oxide and gate conductor in the gate conductor opening.

14 Claims, 10 Drawing Sheets

SELF-ALIGNED DEEP TRENCH DRAM ARRAY DEVICE

BACKGROUND OF THE INVENTION

1. Field of the Invention

This invention describes a technique and method of formation of a DRAM array transistor which is in close proximity to a deep trench (DT) storage capacitor. The array cell device is formed using the Pad SiN, which is also used to create the shallow trench isolation (STI). The array device is self-aligned to the trench storage capacitor.

2. Description of the Related Art

Trench storage cells are used in DRAM products due to the high degree of planarity obtainable with the trench structure. One of the challenges associated with trench DRAM manufacturing, and integrated circuit manufacturing in general, is the control of the lithographic registration (alignment) between the various mask levels used to form the array.

The overlay tolerance required between masking levels is one factor which will limit the scaling of chip area by reduction of array cell size. For example, in a conventional process known as (MINT-BEST) Merged-Isolation Node Trench cell with BuriEd STrap (Nesbit et al. IEDM 1993), lithographic masking levels are used to form the DT, the active area (AA) and the gate conductor (GC). A "buried strap" connection is then made between the top of the trench and the diffusion region. The buried strap eliminates the requirement for a distinct lithographic patterning level to connect the DT and the AA.

As DRAM chips increase in complexity, the area required to store each bit of data on the chip decreases and the area of the array is scaled with increasing DRAM bit counts per chip. A potential scaling limitation associated with the trench DRAM array cell structure is introduced by the area required for the pass transistor which is placed adjacent to the storage capacitor. Further, it is desirable to place the array pass transistor in close proximity to the trench storage capacitor, and thus decrease the area of the array cell.

SUMMARY OF THE INVENTION

The invention comprises a structure and process which enables the trench storage capacitor and array pass transistor to be formed aligned with each other, using the same masking level in the array, and thus enables an improvement in the manufacturing tolerance of the DRAM.

More specifically, one embodiment of the invention is a method of manufacturing an integrated circuit comprising forming a multilayer insulator over a substrate, forming a trench in the insulator and the substrate, undercutting regions of the insulator in proximity to the trench, forming a gate conductor opening between the substrate and the insulator adjacent the trench, and forming a gate oxide and gate conductor in the gate conductor opening.

The invention also includes lining the trench with an insulator and filling the trench with a conductor to form a deep trench storage device and forming a conductive strap between the deep trench storage device and the gate conductor.

The forming of the gate oxide and the gate conductor forms a pass transistor which is connected to the deep trench storage capacitor with a bitline contact. The forming of the transistor comprises forming a field effect transistor and the integrated circuit comprises a dynamic random access memory device. Also, the forming of the gate conductor self-aligns the gate conductor with the trench.

Another embodiment of the invention comprises forming an insulator on a substrate, etching a trench in the insulator and the substrate, depositing a first conductor in a lower portion of the trench, forming a gate opening between the insulator and the substrate adjacent the trench, depositing a gate oxide over the substrate in the gate opening, filing the gate opening with a gate conductor, forming a second conductor in an upper portion of the trench, forming a strap between the trench and the gate conductor, and forming a bitline contact adjacent the gate conductor, such that the gate conductor is positioned between the bitline contact and the trench.

Before the depositing of the first conductor in the lower portion of the trench, the invention includes lining the trench with a second insulator. The depositing of the first conductor in the lower portion of the trench comprises filling the trench with the first conductor and etching the first conductor to remove the first conductor from the upper portion of the trench. The forming of the gate opening comprises undercutting regions of the insulator in proximity to the trench. Before the forming of the second conductor in the upper portion of the trench, the invention includes lining the upper portion of the trench with a collar oxide.

The forming of the pass transistor gate oxide and the gate conductor forms a pass transistor that is connected to the deep trench storage capacitor with the bitline contact. The forming of the transistor comprises forming a field effect transistor and the integrated circuit comprises a dynamic random access memory device. The forming of the gate conductor self-aligns the gate conductor with the trench.

Another embodiment of the invention includes an integrated circuit device comprising a substrate, an insulator over the substrate, a trench in the insulator and the substrate, a gate opening between the insulator and the substrate adjacent the trench, a trench conductor in the trench, a gate conductor in the gate opening, a conductive strap between the trench conductor and the gate conductor, and a bitline contact adjacent the gate conductor, wherein the gate conductor is between the bitline contact and the trench conductor. The gate opening comprises an undercut of the insulator and the gate conductor is self-aligned with the trench.

The invention also includes an insulator between the gate conductor and the trench conductor. The trench conductor comprises a deep trench storage device. The invention also includes a transistor device (including the gate conductor) which connects the deep trench storage device and the bitline contact.

Since the gate is self-aligned by the process used to form the deep trench capacitor, it can be positioned in close proximity to the deep trench capacitor without increasing the chance of a short circuit between the gate and the deep trench capacitor.

Further, the self-aligned nature of the gate avoids the size limits of conventional photolithographic techniques which allows the structure to be made smaller than smallest state of the art photolithographically formed integrated circuit without the manufactory overlay registration tolerances required between a separate capacitor mask and trench capacitor mask.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF PREFERRED EMBODIMENTS OF THE INVENTION

In order to reduce the chip area required by a pass transistor for a deep trench storage DRAM device, such as the MINT-BEST cell described above, the trench storage capacitor should be placed in close proximity to the array device. In the invention, the conventional metal oxide semiconductor field effect transistor (MOSFET) device used in the DRAM array is replaced with a device formed in the pad SiN sidewall around the periphery of the DT storage device. In the invention, described with reference to the drawings below, the pad SiN, which is used to form both the trench and the STI in conventional trench DRAM technology, is also used to form the array transistor.

Figure 1:
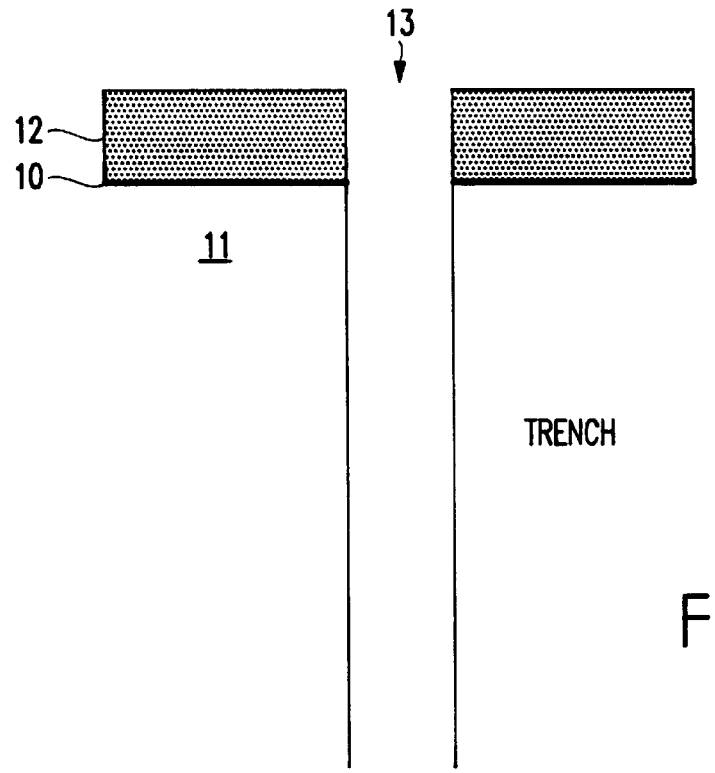
FIG. 1 is a schematic cross-sectional view of a partially completed structure according to the invention.

Referring now to FIG. 1, a pad layer of a dielectric, such as thermal silicon dioxide 10, or any other similar oxide or nitride, is grown or deposited to a thickness of between 3 nm and 10 nm on a silicon substrate 11, or any other similar substrate material. A pad layer of a thicker insulator, such as SiN 12, or any other similar oxide or nitride insulator, is deposited to a thickness of between 100 nm and 300 nm using, for example, low pressure chemical vapor deposition (LPCVD), or any other similar deposition process. A deep trench 13 is formed using conventional photolithography and dry etching techniques, such as a reactive ion etch in a plasma containing a combination of agents such as $Cl_2$, $BC_3$, $NF_3$, $O_2$, $N_2$, HCl. The trench 13 is preferably etched to a depth of between 4 um and 8 um.

Figure 2:
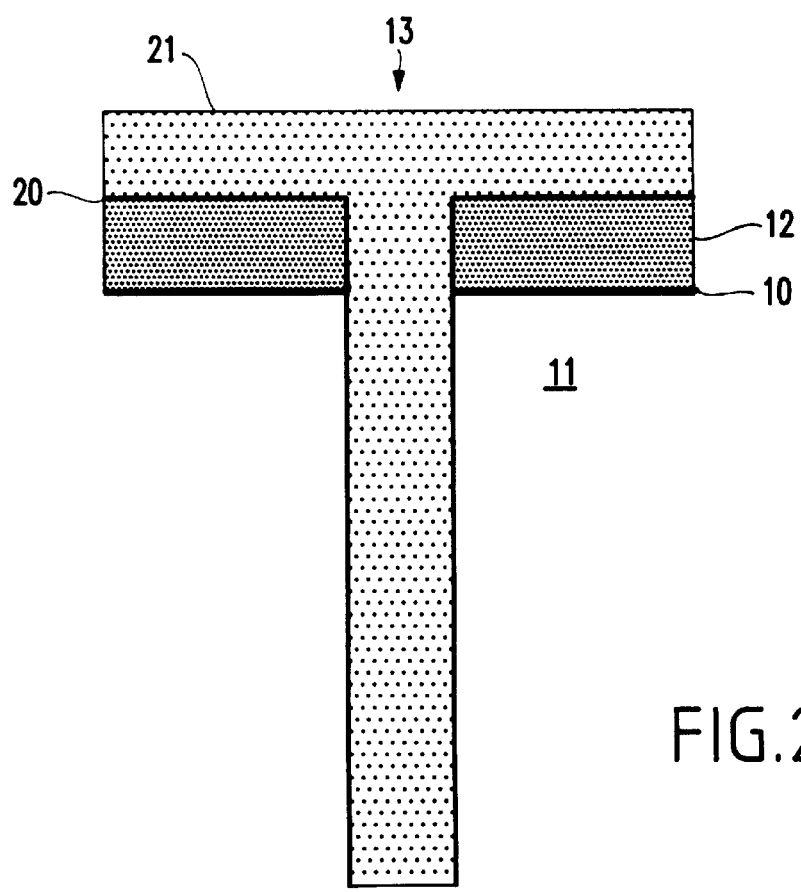
FIG. 2 is a schematic cross-sectional view of a partially completed structure according to the invention.
Figure 3:
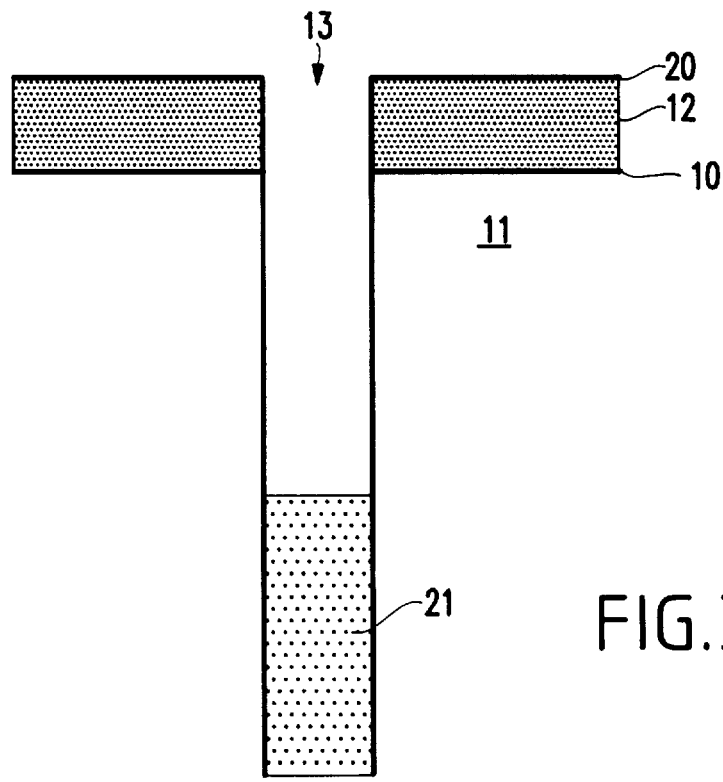
FIG. 3 is a schematic cross-sectional view of a partially completed structure according to the invention.

FIG. 2 shows a thin capacitor node dielectric 20 formed using SiN growth and/or deposition (LPCVD), and a re-oxidation. The trench 13 is filled with doped polysilicon 21 using, for example, LPCVD. In FIG. 3, the doped polysilicon 21 is planarized to the wafer surface using, for example, chemical mechanical polishing (CMP) or dry etching. Then the doped polysilicon 21 is recessed using a dry etch combination containing for example, $SF_6$, $CF_4$, HBr, to a depth of 0.8 um to 1.5 um below the surface of the pad SiN 12.

Figure 4:
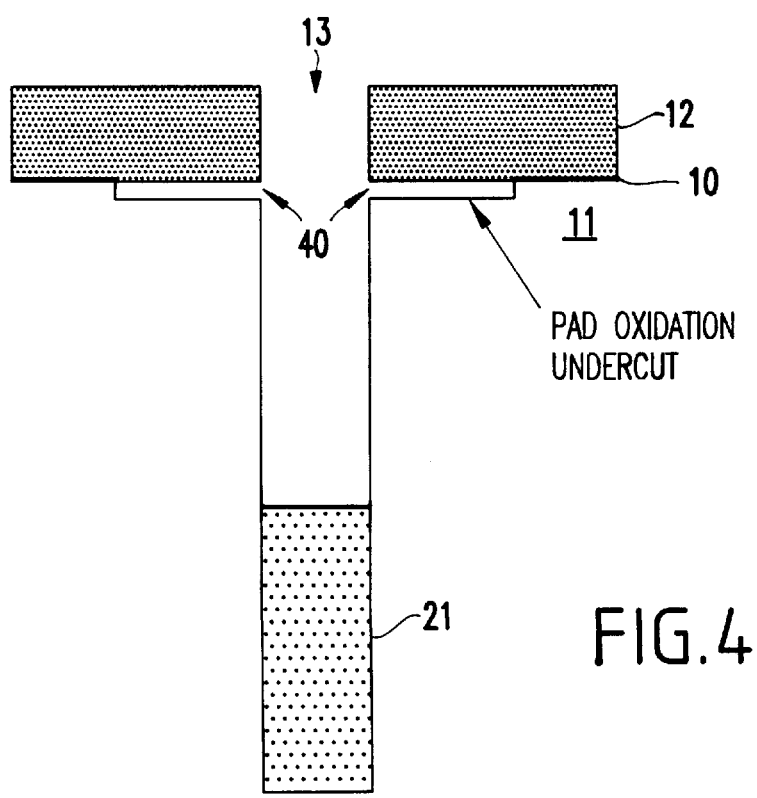
FIG. 4 is a schematic cross-sectional view of a partially completed structure according to the invention.

In FIG. 4, the thin node dielectric 20 is etched away from the upper region of the trench 13, using, for example, an isotropic wet or dry etch. This etching process exposes the pad oxidation 10 under the pad SiN 12 to the inside of the trench 13. The pad oxidation 10 is then undercut using, for example, a wet etch, such as a solution containing HF. In the cases of a wet etch undercut, the extent of the undercut 40 is controlled by the duration of the wet etch. If a dry or vapor etch is used to form the undercut 40, as would be known by one ordinarily skilled in the art given this disclosure the extent of the undercut 40 may be selected by the choice of undercut process conditions such as pressure, temperature, or gas mixture.

Figure 5:
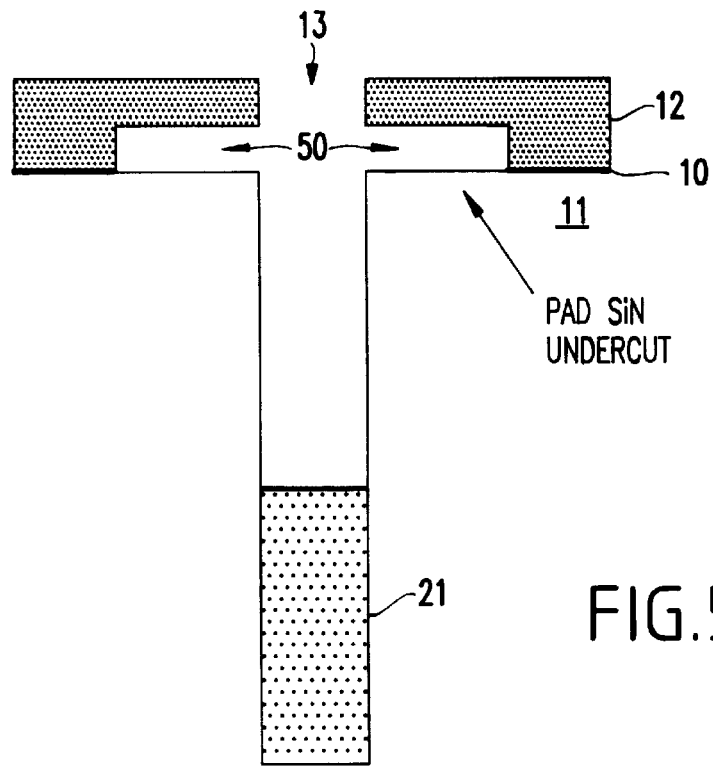
FIG. 5 is a schematic cross-sectional view of a partially completed structure according to the invention.

In FIG. 5, the pad SiN 12 is isotropically etched and undercut 50 using a wet or dry process such as wet HF at 50° C. The extent of the pad SiN undercut 50 is determined by the extent of the pad oxidation undercut 40. The amount of material removed by the pad SiN undercut will be small compared with the lateral extent of the pad oxide undercut. The pad SiN 12 is also thinned by this isotropic etching.

Figure 6:
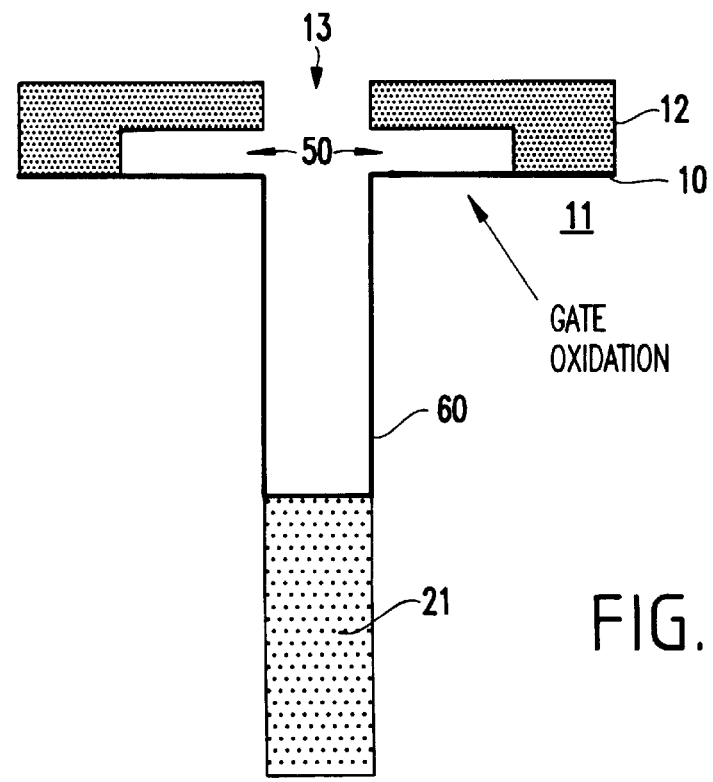
FIG. 6 is a schematic cross-sectional view of a partially completed structure according to the invention.
Figure 7:
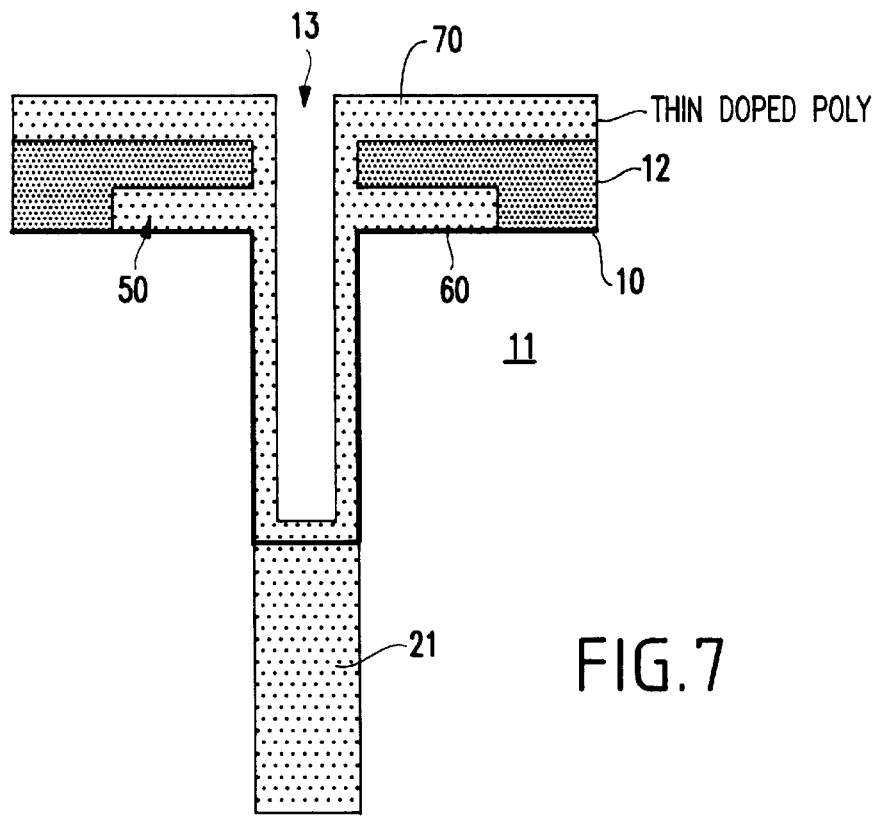
FIG. 7 is a schematic cross-sectional view of a partially completed structure according to the invention.

A gate oxidation 60 is grown in the upper region of the trench 13 sidewall, on the polysilicon 21 in the lower protion of the trench, and in the exposed single-crystal silicon 11 in the undercut 50 pad SiN 12, as shown in FIG. 6. Then, as shown in FIG. 7, a gate conductor, such as a thin layer of doped polysilicon 70 is deposited using, for example, a low pressure chemical vapor deposition (LPCVD) process. The undercut region 50 of the pad SiN 12 is filled and pinched off with the doped polysilicon 70.

Figure 8:
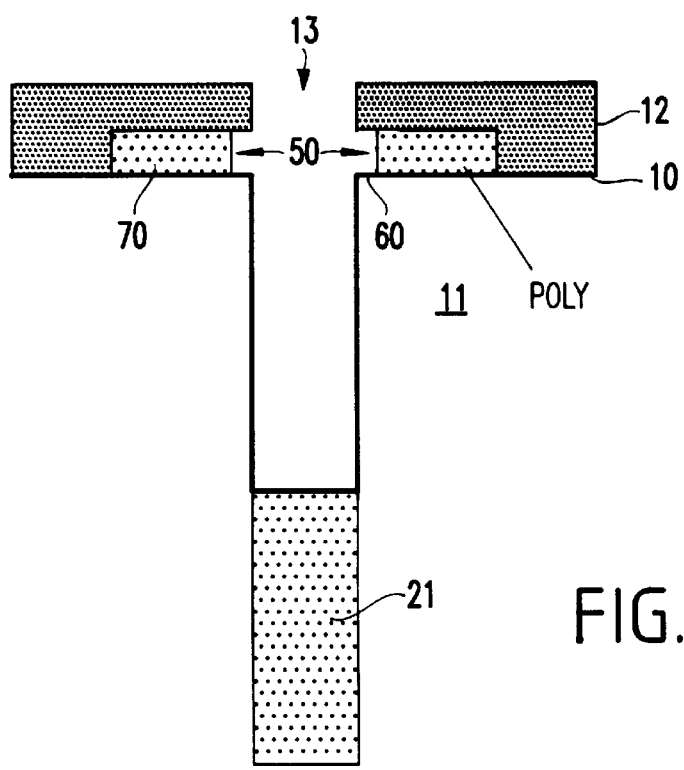
FIG. 8 is a schematic cross-sectional view of a partially completed structure according to the invention.

In FIG. 8, the thin gate conductor 70 is isotropically removed using, for example, a dry etch process preferably containing $SF_6$. The amount of removal overetch is selected such that the gate conductor 70 will substantially remain in the undercut pad SiN regions 50 to eventually become the gate of the inventive transistor. The single-crystal silicon substrate 11 is protected from the isotropic gate conductor etch by the gate oxide 60.

Figure 9:
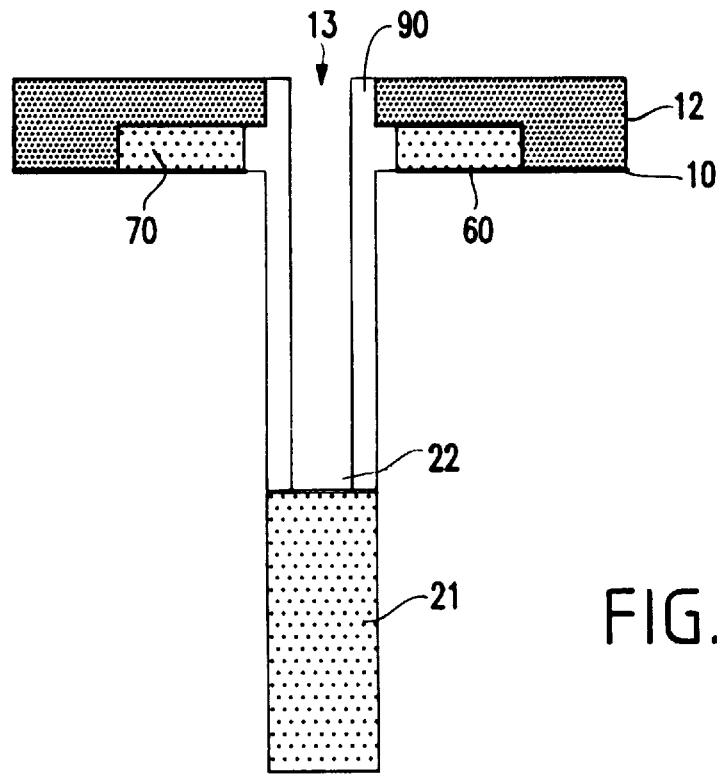
FIG. 9 is a schematic cross-sectional view of a partially completed structure according to the invention.

FIG. 9 shows an isolation collar 90 which is formed using, for example, conformal deposition of a dielectric (such as silicon oxide) and an anisotropic dry etch, to form the sidewall spacer collar 90. During the dry etch, the collar oxide material 90 is removed from the upper surface of pad SiN 12 and the base of the collar 22 (e.g., the upper surface of the polysilicon 21) because the anisotropic dry etch removes material from horizontal surfaces at a substantially higher rate than it removes material from vertical surfaces. The gate oxidation 60 will also be removed from the base of the collar 22 by the dry etching.

Figure 10:
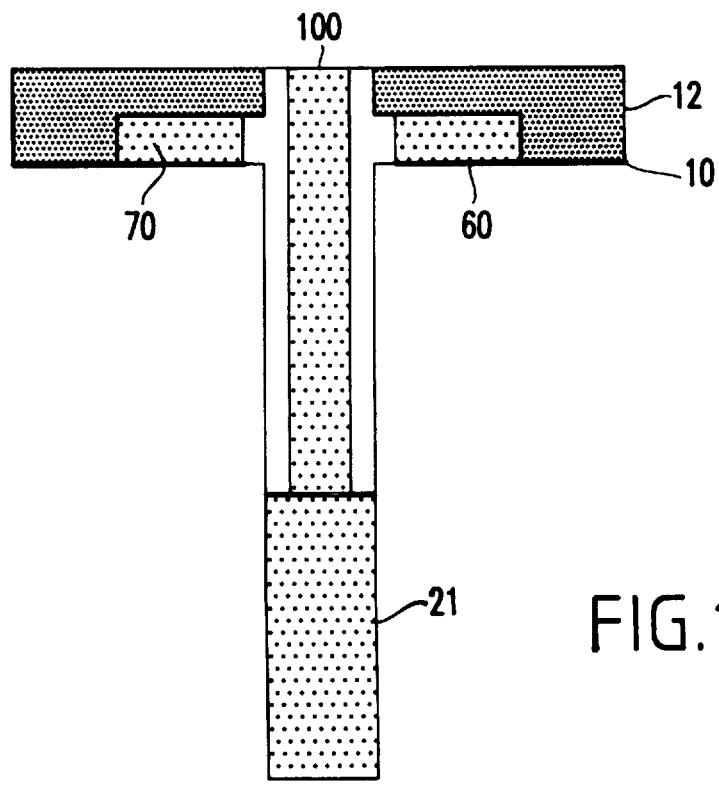
FIG. 10 is a schematic cross-sectional view of a partially completed structure according to the invention.
Figure 11:
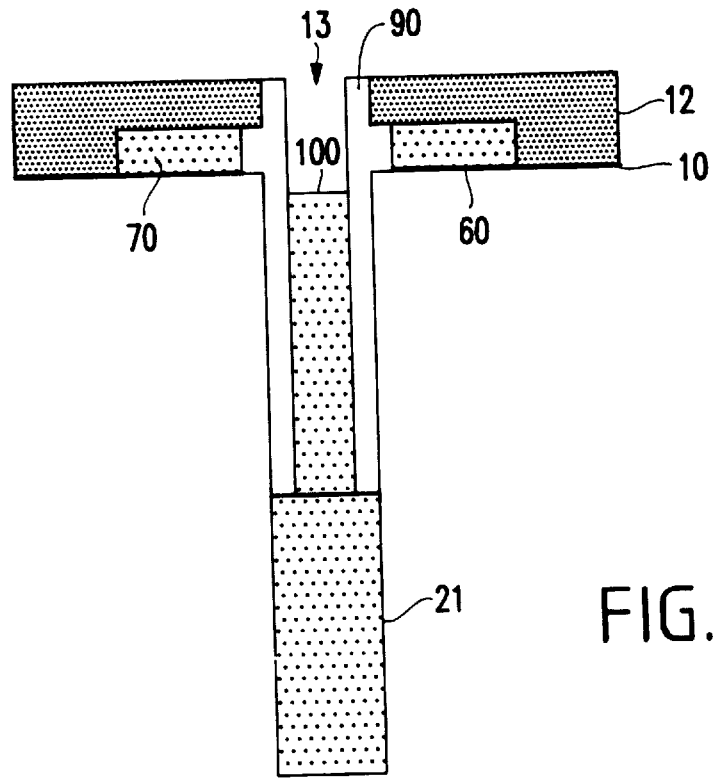
FIG. 11 is a schematic cross-sectional view of a partially completed structure according to the invention.

In FIG. 10 a doped polysilicon 100 is deposited using, for example, (LPCVD), and planarized to the pad SiN 12 surface using dry etch or chemical-mechanical planarization (CMP). In FIG. 1 the doped polysilicon 100 is recessed to a depth of between 50 nm and 150 nm below the silicon surfaces using a dry etch process such as an SF6 plasma.

Figure 12:
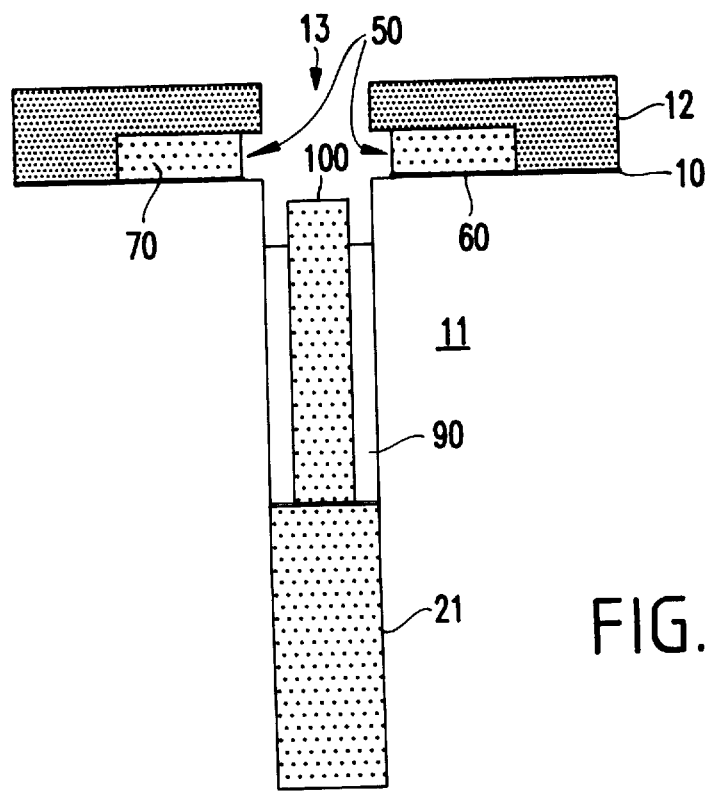
FIG. 12 is a schematic cross-sectional view of a partially completed structure according to the invention.
Figure 13:
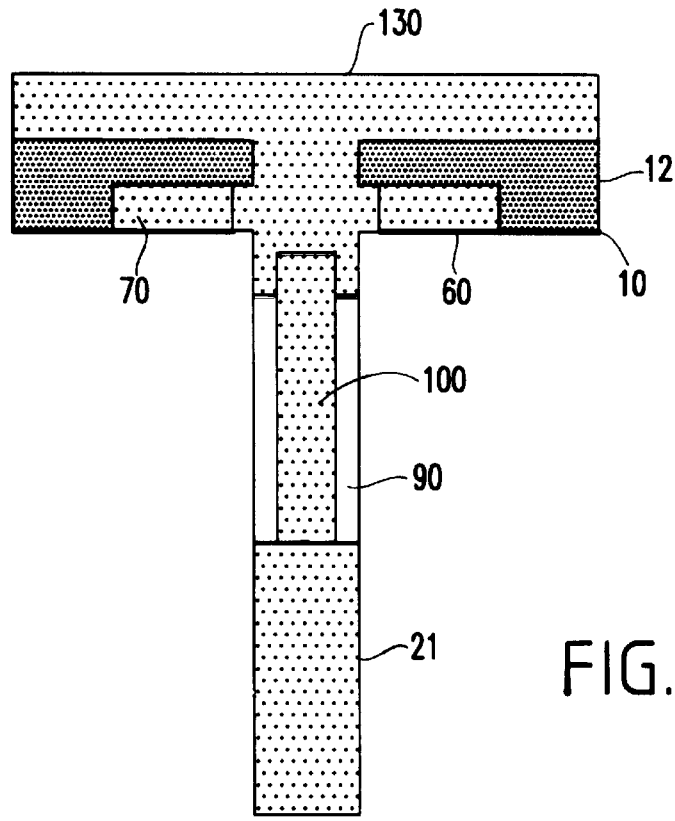
FIG. 13 is a schematic cross-sectional view of a partially completed structure according to the invention.

In FIG. 12 the collar oxide 90 is isotropically removed using, for example, a wet etch process containing HF, which exposes the upper region of the single crystal silicon 11, the gate polysilicon 60 sidewall, and the trench 13 polysilicon. In FIG. 13 a silicon film 130 is deposited using CVD or selective epitaxy. This film 130 may be polysilicon, amorphous silicon, or epitaxial silicon.

Figure 14:
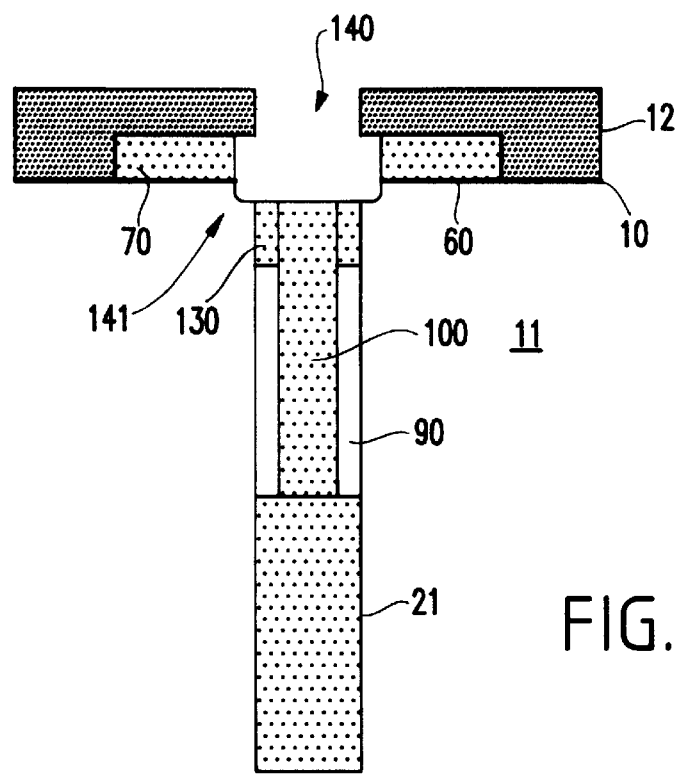
FIG. 14 is a schematic cross-sectional view of a partially completed structure according to the invention.

FIG. 14 shown that the silicon layer 130 is recessed to a depth 140 of between 10 nm and 50 nm below the silicon surface using, for example, an anisotropic dry etch process. This allows the region of silicon connecting the trench 13 and the single-crystal silicon 11 to act as a buried strap 141.

Figure 15:
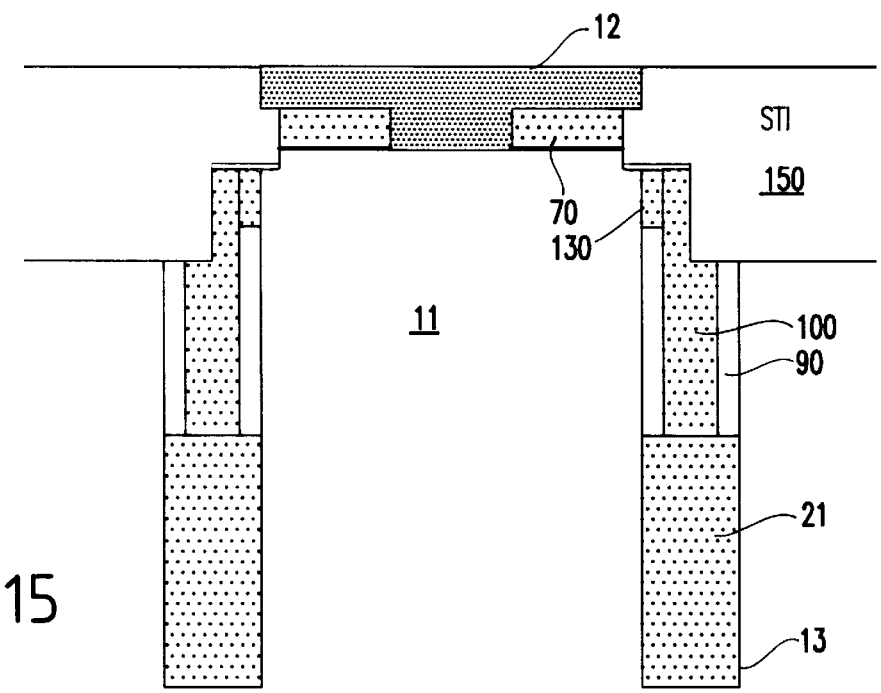
FIG. 15 is a schematic cross-sectional view of a partially completed structure according to the invention.

In FIG. 15 a shallow trench isolation (STI) region 150 is formed using conventional lithography, dry etch, dielectric deposition, and planarization techniques well known to those ordinarily skilled in the art. For example, a mask is used to protect areas other than the STI region 150 and an etch removes material not protected by the mask to form an opening for the STI 150. The opening is then filled with a dielectric, such as an oxide or nitride, using, for example a CVD process. The surface of the shallow trench isolation dielectric can then be planarized using, for example, chemical-mechanical polishing.

Figure 16:
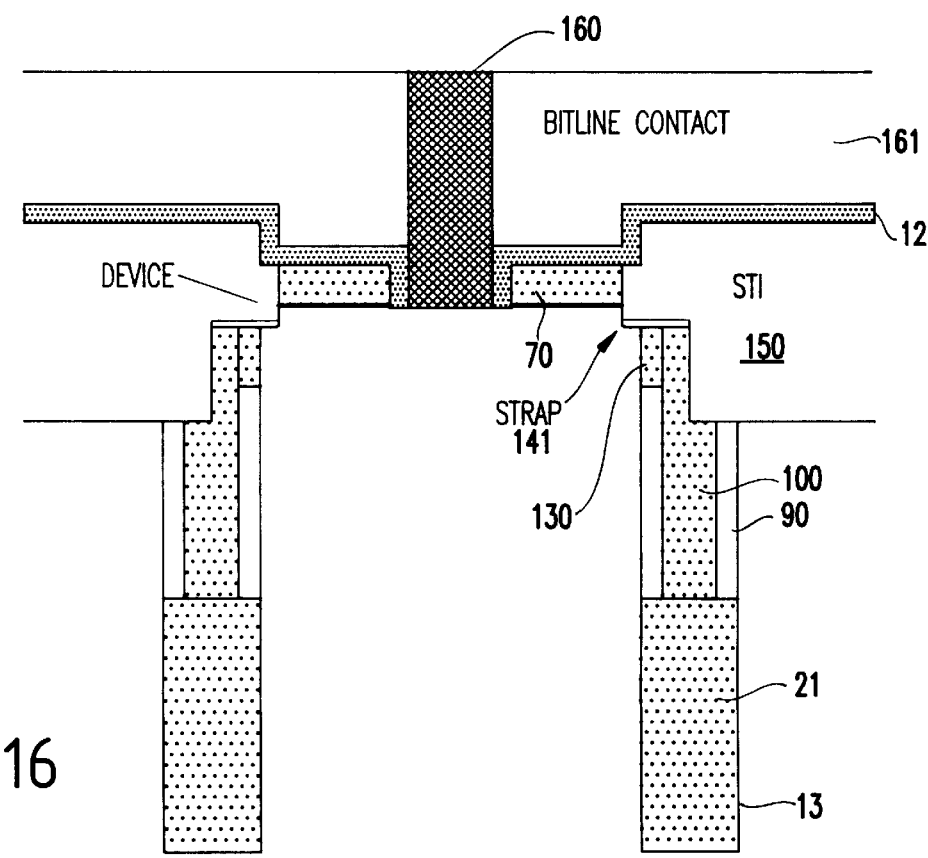
FIG. 16 is a schematic cross-sectional view of a completed structure according to the invention.

In FIG. 16 a bitline contact 160 is formed again using conventional lithography, dry etch, deposition, and planarization. For example, an insulator layer 161 can be formed and an opening for the bitline contact 160 in the insulator layer can be formed using a patterned mask and etching. The etching would also remove a portion of the insulator 12. The opening is then filled with a conductive material, such a polysilicon, metal or alloy to form the bitline contact 160.

Figure 17:
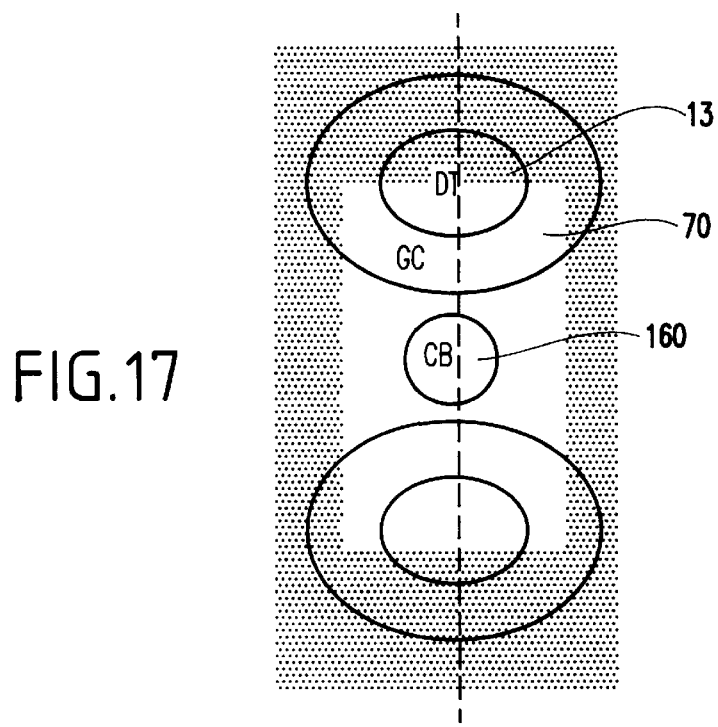
FIG. 17 is a schematic top view showing a deep trench, a gate conductor annular region around the deep trench, a shaded shallow trench isolation region, and a bitline contact.
Figure 18:
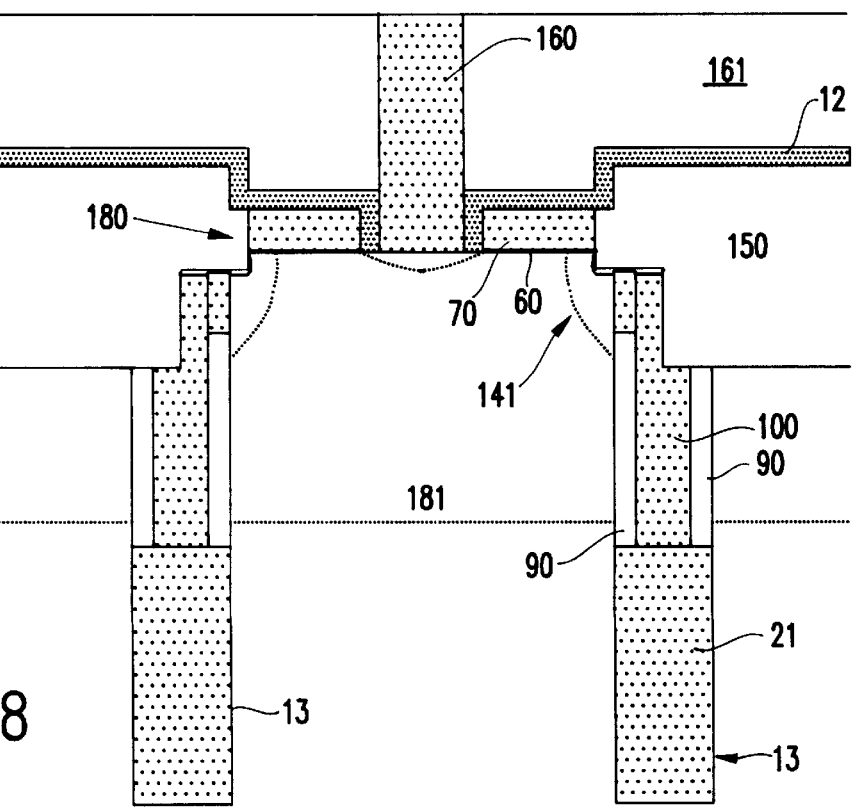
FIG. 18 is a schematic cross-sectional view of a completed structure according to the invention.

FIG. 17 shows a top-down view of the inventive structure. More specifically, FIG. 17 shows the deep trench DT 13, the gate conductor GC 70 annular region around the deep trench DT, the shaded shallow trench isolation STI region and the bitline contact CB 160. FIG. 18 shows an exemplary cross-sectional view of the completed device 180, the STI 150, trench-to-device buried strap diffusion 141, and a p-well 181.

Figure 19:
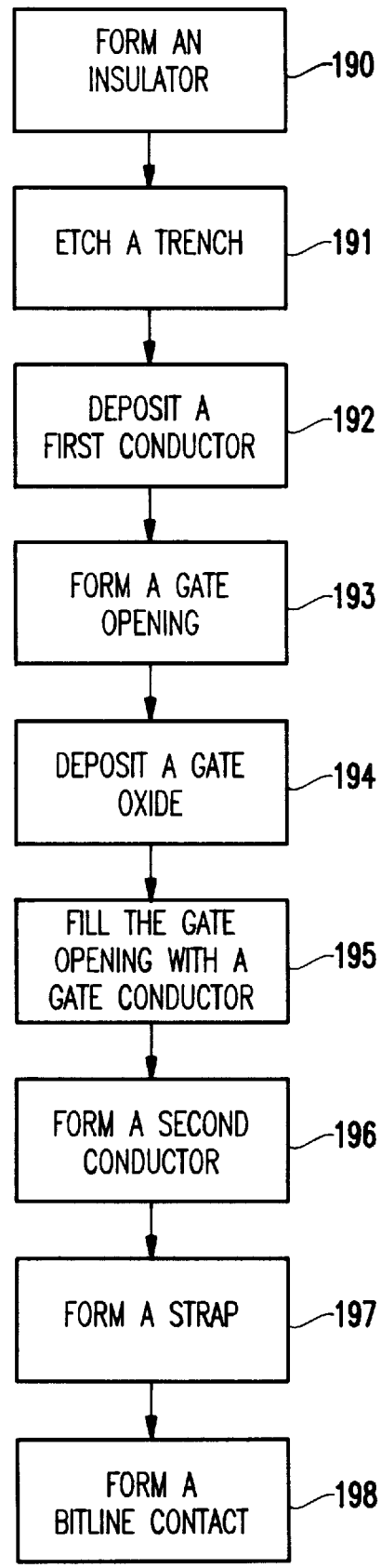
FIG. 19 is a flow diagram illustrating a preferred method of the invention.

FIG. 19 is a flowchart illustrating an embodiment of the invention. More specifically, in item 190 the insulator 12 is formed and in item 191, the trench 13 is etched. In item 192, the first conductor 21 is deposited and in item 193, the gate opening 50 is formed. Further, in item 194, the gate oxide 60 is deposited and in item 195 the gate opening is filed with a gate conductor 70. FIG. 19 also shows, in item 196, the second gate conductor 100 is formed and in item 197 the strap is formed 130. Also in item 198 the bitline contact is formed.

Therefore, as shown above, the invention uses the pad SiN12, in the formation of the trench 13, the STI region 150 and the array transistor 180. The invention forms the deep trench capacitor 182 including the conductors 21, 100 and the collar oxide 90 using mostly conventional processes. Similarly, the shallow trench isolation region 150 and the buried strap 141 are formed using mostly conventional techniques.

However, the conventional techniques for forming such structures are modified in the invention to form the self-aligned gate conductor 70 within the SiN layer 12. Since the gate 70 is self-aligned by the process used to form the deep trench capacitor 13, it can be positioned in close proximity to the deep trench capacitor 13 without increasing the chance of a short circuit between the gate 70 and the deep trench capacitor 13.

Further, the self-aligned nature of the gate 70 avoids the size limits of conventional photolithographic techniques which allows the structure to be made smaller than smallest state of the art photolithographically formed integrated circuit. An additional advantage is that the array device gate is formed without a dedicated lithographic masking level.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. A method of manufacturing an integrated circuit comprising:

forming an insulator over a substrate;

forming a trench in said insulator and said substrate;

undercutting said insulator to form a gate conductor opening between said substrate and said insulator adjacent said trench; and forming a gate oxide and gate conductor in said gate conductor opening.

2. The method in claim 1, further comprising lining said trench with an insulator and filling said trench with a conductor to form a deep trench storage device.

3. The method in claim 2, further comprising forming a conductive strap between said deep trench storage device and said gate conductor.

4. The method in claim 2, wherein said forming of said gate oxide and said gate conductor comprises forming a transistor connecting said deep trench storage device with a bitline contact.

5. The method in claim 4, wherein said forming of said transistor comprises forming a field effect transistor and said integrated circuit comprises a dynamic random access memory device.

6. The method in claim 1, wherein said forming of said gate conductor self-aligns said gate conductor with said trench.

7. A method of manufacturing an integrated circuit comprising:

forming an insulator on a substrate;

etching a trench in said insulator and said substrate;

depositing a first conductor in a lower portion of said trench forming a gate opening between said insulator and said substrate adjacent said trench;

depositing a gate oxide over said substrate in said gate opening;

filing said gate opening with a gate conductor;

forming a second conductor in an upper portion of said trench;

forming a strap between said trench and said gate conductor; and forming a bitline contact adjacent said gate conductor, such that said gate conductor is positioned between said bitline contact and said trench.

8. The method in claim 7, further comprising, before said depositing of said first conductor in said lower portion of said trench, lining said trench with a second insulator.

9. The method in claim 7, wherein said step of depositing said first conductor in said lower portion of said trench comprises filling said trench with said first conductor and etching said first conductor to remove said first conductor from said upper portion of said trench.

10. The method in claim 7, wherein said forming of said gate opening comprises undercutting said insulator.

11. The method in claim 7, further comprising, before said forming said second conductor in said upper portion of said trench, lining said upper portion of said trench with a collar oxide.

12. The method in claim 7, wherein said forming of said gate oxide and said gate conductor comprises forming a transistor connecting said deep trench storage capacitor with said bitline contact.

13. The method in claim 7, wherein said forming of said transistor comprises forming a field effect transistor and said integrated circuit comprises a dynamic random access memory device.

14. The method in claim 7, wherein said forming of said gate conductor self-aligns said gate conductor with said trench.

* * * * *